(12) United States Patent
Yu et al.

(10) Patent No.: US 10,510,652 B2
(45) Date of Patent: Dec. 17, 2019

(54) METHOD OF MANUFACTURING SEMICONDUCTOR DEVICE

(71) Applicant: TAIWAN SEMICONDUCTOR MANUFACTURING COMPANY LTD., Hsinchu (TW)

(72) Inventors: Tsung-Yuan Yu, Taipei (TW); Hao-Yi Tsai, Hsinchu (TW); Chao-Wen Shih, Hsinchu (TW); Hung-Yi Kuo, Taipei (TW); Pi-Lan Chang, Kaohsiung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 204 days.

(21) Appl. No.: 15/237,410

(22) Filed: Aug. 15, 2016

(65) Prior Publication Data
US 2018/0047664 A1    Feb. 15, 2018

(51) Int. Cl.
*H01L 23/498* (2006.01)
*H01L 21/48* (2006.01)
*H01L 23/00* (2006.01)

(52) U.S. Cl.
CPC .... *H01L 23/49838* (2013.01); *H01L 21/4853* (2013.01); *H01L 21/4857* (2013.01);
(Continued)

(58) Field of Classification Search
CPC ........... H01L 23/49838; H01L 21/4853; H01L 21/4857
See application file for complete search history.

(56) References Cited

U.S. PATENT DOCUMENTS 5,258,648 A * 11/1993 Lin ..................... G01R 31/2863
257/747
6,541,857 B2    4/2003 Caletka et al.
(Continued)

FOREIGN PATENT DOCUMENTS

CN     103096618 A      5/2013
KR     1020060093382 A  8/2006

OTHER PUBLICATIONS

Office action dated Jun. 12, 2017 from the Chinese Intellectual Property Office for Chinese application 201410377149.1.
(Continued)

*Primary Examiner* — Errol V Fernandes
(74) *Attorney, Agent, or Firm* — WPAT, P.C., Intellectual Property Attorneys; Anthony King

(57) ABSTRACT

A method of manufacturing a semiconductor device includes: receiving a first substrate with a surface; receiving a second substrate; determining a pad array on the surface of the first substrate, wherein the pad array includes a first type pad and a second type pad; forming a via pattern underlying the pad array in the first substrate according to the location of each via, wherein the first type pad in the pad array is directly contacting a via of the via pattern and the second type pad in the pad array is clear of any via of the via pattern; laterally connecting the second type pad with a conductive trace, wherein the conductive trace connects to another via that is same level with the via contacting the first type pad; and disposing a first conductive bump and a second conductive bump between the first substrate and the second substrate.

20 Claims, 20 Drawing Sheets

(52) U.S. Cl.
CPC ........ *H01L 23/49822* (2013.01); *H01L 24/16* (2013.01); *H01L 24/81* (2013.01); *H01L 2224/16227* (2013.01); *H01L 2224/81125* (2013.01); *H01L 2224/81815* (2013.01)

(56) References Cited

U.S. PATENT DOCUMENTS

| | | | |
|---|---|---|---|
| 6,940,176 B2 * | 9/2005 | Chen | H01L 23/49816 257/686 |
| 2013/0299970 A1 | 11/2013 | Harada et al. | |
| 2015/0137355 A1 * | 5/2015 | Yu | H01L 21/76898 257/737 |

OTHER PUBLICATIONS

Notice of allowance and its english translation of the corresponding Korean application 10-2014-0159050 from KIPO dated Aug. 22, 2016.
English translation of KR1020060093382.
Office action and search report dated Jan. 17, 2017 from the Chinese Intellectual Property Office for Chinese application 201410377149.1.
English abstract translation for CN 103096618 A.

\* cited by examiner

METHOD OF MANUFACTURING SEMICONDUCTOR DEVICE

CROSS REFERENCE TO RELATED APPLICATION

This application is a divisional of application Ser. No. 14/230,775 fled on Mar. 31, 2014, which claims priority to U.S. Non-Provisional application Ser. No. 14/082,714 filed Nov. 18, 2013 which application is incorporated herein by reference, in its entirety, for any purpose.

FIELD

The disclosure relates to a semiconductor device and a method of manufacturing a semiconductor device.

BACKGROUND

Electronic equipments involving numbers of semiconductor devices are indispensable from our daily life. With the advancement of electronic technology, the electronic equipment has becomes smaller in size and has to execute and perform more and more complicated and multiple functions. Thus, the electronic equipment becomes more compact involving more numbers of electronic components, and becomes more complex in structure involving high density of input/output (I/O) terminals within such a small area.

A wafer level packaging (WLP) technology has been gaining in popularity. This technology provides a wafer level manufacturing of the semiconductor device with high functions and performances while small size of the semiconductor device. During manufacturing of the semiconductor device, a surface mounting technology (SMT) is employed for miniaturizing the semiconductor device. The semiconductor device includes a substrate mounting on another substrate, so that a pad of the substrate is bonded and electrically connected with a pad of another substrate through a solder ball.

The pads of the substrate are formed on a top surface of the substrate by various methods. However, the pads formed by different methods would provide different reliability with respect to drop test, thermal cycling, bending or etc. For example, some pads would be able to withstand a high stress level and thus cracks would not be developed easily, while some pads would be able to withstand a high temperature and thus delamination from the substrate is minimized.

As such, there is a continuous demand on improving the configuration of the pads on the substrate and manufacturing operations of the pads to optimize reliability of the pads and solve the above deficiencies.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale, in fact, the dimensions of the various features may be arbitrarily increased or reduced for clarity of discussion.

DETAILED DESCRIPTION OF THE INVENTION

Figure 1A:
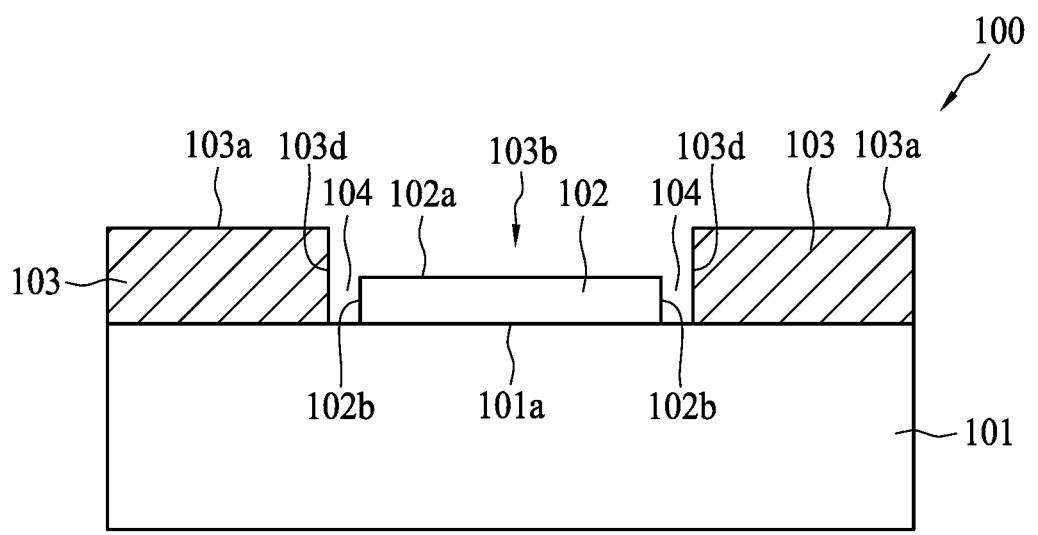
FIG. 1A is a cross sectional view of a semiconductor device with a non via in pad (NVIP) in accordance with some embodiments of the present disclosure.

In the surface mount technology (SMT), the semiconductor device includes at least two substrates. One of the substrates is stacked on another one of the substrates by attaching a pad of the substrate with a pad of another substrate through a conductive bump such as a solder joint or a solder bump. The pad of the substrate is formed by sputtering or electroplating a conductive material on the substrate, so that the pad conducts an electricity between a circuitry of the substrate and a circuitry of another substrate external to the substrate. The pad of the substrate is then covered by a soldering material in order to selectively expose a top surface of the pad. The pad could be exposed by various methods which define an area on the top surface of the pad for receiving the bump. The exposed surface of the pad is then attached with the bump.

However, the above configuration of the pad on the substrate have some issues such as reduction of adhesion between the pad and the substrate, poor performance in mechanical testing such as board bending or drop test, stress concentration on a periphery of the pad, poor reliability in a board level temperature cycling, etc. As the pad formed and exposed by different methods would have different issues, ultimately the substrate would overall have low reliability and poor functional performance.

The manufacturing and use of the embodiments of the present invention are discussed in details below. It should be appreciated, however, that the embodiments provide many applicable inventive concepts that can be embodied in a wide variety of specific contexts. It is to be understood that the following disclosure provides many different embodiments or examples for implementing different features of various embodiments. Specific examples of components and arrangements are described below to simplify the present disclosure. These are, of course, merely examples and are not intended to be limiting.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Further, it is understood that several processing steps and/or features of a device may be only briefly described. Also, additional processing steps and/or features can be added, and certain of the following processing steps and/or features can be removed or changed while still implementing the claims. Thus, the following description should be understood to represent examples only, and are not intended to suggest that one or more steps or features is required.

In addition, the present disclosure may repeat reference numerals and/or letters in the various examples. This repetition is for the purpose of simplicity and clarity and does not in itself dictate a relationship between the various embodiments and/or configurations discussed.

In the present disclosure, a semiconductor device with an improved configuration is disclosed. The semiconductor device includes a substrate and several pads on the substrate which are in a combination of at least two different types of pads. One type, called first type pad, is directly contacting a conductive via lying underneath the pad. In some embodiments, the first type pad is also called via-in-pad (VIP). Another type, called second type pad, is not directly contacting any conductive via in the substrate. In some embodiments, the second type pad is also called non via-in-pad (NVIP). In the present disclosure, for convenience, the VIP is used alternatively with the first type pad and the NVIP is used alternatively with the second type pad. VIP is arranged in a fine pitch region, for example, the pad pitch is substantially under 350 µm, in order to provide higher package density. For NVIP, since the pad is configured to be more resistant to the stress test, it is arranged on a predetermined location, which receives a higher stress concentration during packaging process. From adopting a combination of VIP and NVIP, disadvantages of the VIP pads and the NVIP pads are offset and thus the substrate as a whole possesses advantages contributed from the VIP pads and the NVIP pads, such as high reliability with respect to the board level temperature cycle, good performance in drop test, reduction in number of stress concentration point, etc.

Some distinguishing features between VIP and NVIP are discussed herein for reader's understanding. Both VIP and NVIP are disposed on a surface of a substrate and designed as a conductive contact pad for receiving a conductor or conductive bump. The substrate can be either a semiconductor die or a printed circuit board (PCB). For a VIP, a conductive via is disposed right underlying the pad. Further, the pad is directly contacting the via without extra routing. In some embodiments, the size of the via is within the projection area of the VIP. If an observer views a VIP from the top, the via is invisible since it is covered by the pad.

For a NVIP, there is no conductive via disposed right underlying the pad. The NVIP is standing clear off (or isolation from) any conductive via, further, a dielectric is disposed underlying the NVIP. In other words, the NVIP is floated on the dielectric without directly contacting any conductive via. Similar to VIP, only the pad is visible from a top view perspective for a NVIP, however, it is distinguishable if the observer views from the cross sectional direction. For a NVIP, there is no any conductive via directly contacting the pad. In some embodiments, a conductive trace is arranged on the same level of the NVIP to connect the NVIP to a via offset the NVIP. Therefore, the NVIP is able to communicate with conductive features in a different level.

FIG. 1A is an embodiment of a semiconductor device 100. The semiconductor device 100 includes a substrate 101. In some embodiments, the substrate 101 is a circuit board including silicon for carrying a circuitry within the silicon substrate and supporting, several semiconductor components connected to the circuitry. The silicon includes several conductive layers and several dielectric layers. The conductive layers include some conductive traces for electrically connecting several semiconductor components on the silicon substrate. The dielectric layers are configured for insulation between the conductive traces. In some embodiments, the circuit board is a printed circuit board (PCB) including some integrated circuits (IC) for electrical connection of the semiconductor components thereon. In some embodiments, the substrate 101 is in a strip shape.

In some embodiments, the semiconductor device 100 includes a pad 102 disposed on a surface 101a of the substrate 101. The pad 102 is extended horizontally along the surface 101a. In some embodiments, the pad 102 is under bump metallurgy (UBM) pad for receiving a conductive bump including copper, tin, lead or etc. The UBM pad is a solderable surface which is exposed for receiving the bump and electrically connecting the pad 102 with a circuitry internal to the substrate 101. The pad 102 is bonded with the bump after heat treatment such as reflow.

In some embodiments, the pad 102 is disposed on the surface 101a by various methods such as electroplating, sputtering, etc. In some embodiments, the pad 102 includes a conductive material such as gold, silver, copper, nickel, tungsten, aluminum, and/or alloys thereof.

In some embodiments, the semiconductor device 100 includes a mask 103 disposed over the surface 101a of the substrate 101. In some embodiments, the mask 103 is a solder mask and spaced from the pad 102. The mask 103 surrounds the pad 102. There is a gap 104 between the mask 103 and the pad 102. The mask 103 is not contacted with the pad 102 and does not cover the pad. In some embodiments, a top surface 103a of the mask 103 is at a level above a top surface 102a of the pad 102. In some embodiments, a top surface 103a of the mask 103 is substantially at a same level of a top surface 102a of the pad 102.

In some embodiments, the mask 103 includes a polymeric material such as liquid epoxy, polyepoxide or etc. In some embodiments, the mask 103 is disposed on the surface 101a of the substrate 101 by silk screening, spraying, etc.

In some embodiments, the mask 103 includes a first recessed portion 103b. The first recessed portion 103b surrounds the pad 102, that the pad 102 is disposed within the first recessed portion 103b of the mask 103. In some embodiments, the first recessed portion 103b is extended from the top surface 103a of the mask 103 to the top surface 101a of the substrate 101.

In some embodiments, the pad 102 is a non via in pad (NVIP). The NVIP 102 is disposed within the first recessed portion 103b and is spaced from the mask 103. The NVIP 102 is isolated from the mask 103. The top surface 102a and the peripheral portion 102b of the pad 102 are not covered by the mask 103. The top surface 102a of the NVIP 102 is absent from the mask 103. An area of the NVIP 102 for receiving the bump is not dependent on a size of the first recessed portion 103b. The first recessed portion 103b is larger than the NVIP 102.

Figure 1B:
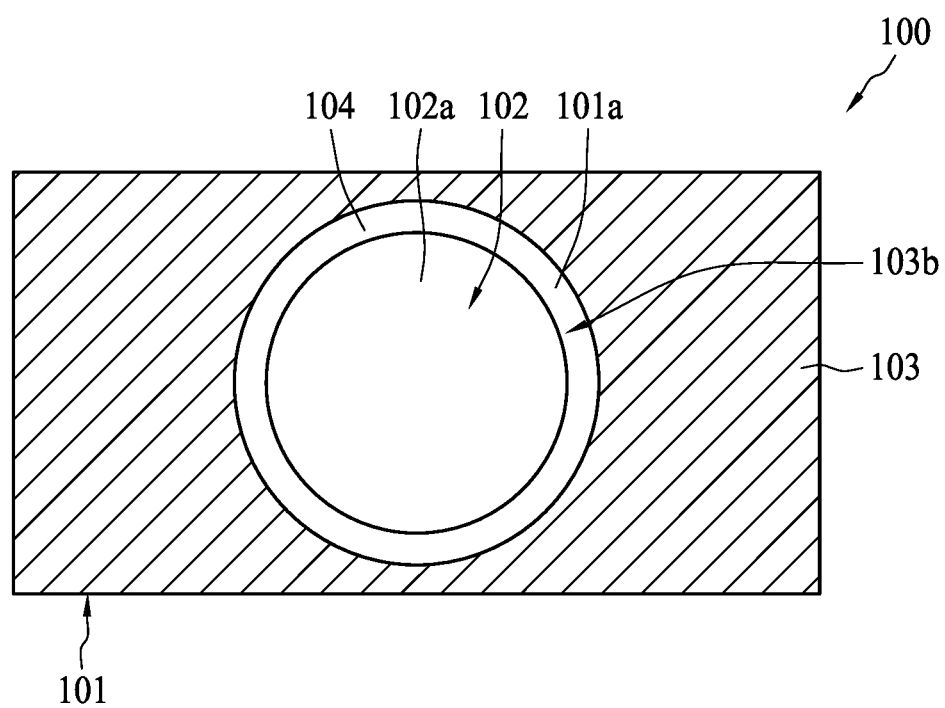
FIG. 1B is a top view of a semiconductor device with an NVIP in accordance with some embodiments of the present disclosure.

FIG. 1B is a top view of an embodiment of the semiconductor device 100 in FIG. 1A. The semiconductor device 100 includes a substrate 101, a pad 102 and a mask 103. In some embodiments, the mask 103 substantially covers a top surface 101a of a substrate 101. The mask 103 includes a first recessed portion 103b surrounding the pad 102, so that the mask 103 is spaced from the pad 102. In some embodiments, there is an annular gap 104 between the pad 102 and the mask 103. The annular gap 104 surrounds the pad 102.

Figure 2A:
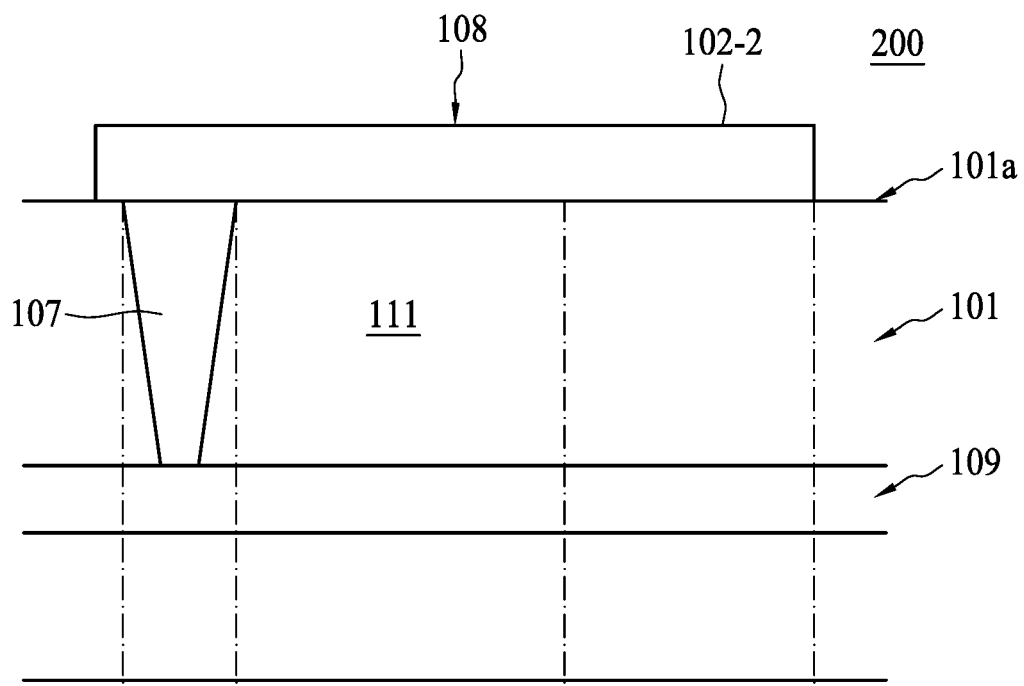
FIG. 2A is a cross sectional view of a semiconductor device with an NVIP in accordance with some embodiments of the present disclosure.
Figure 2B:
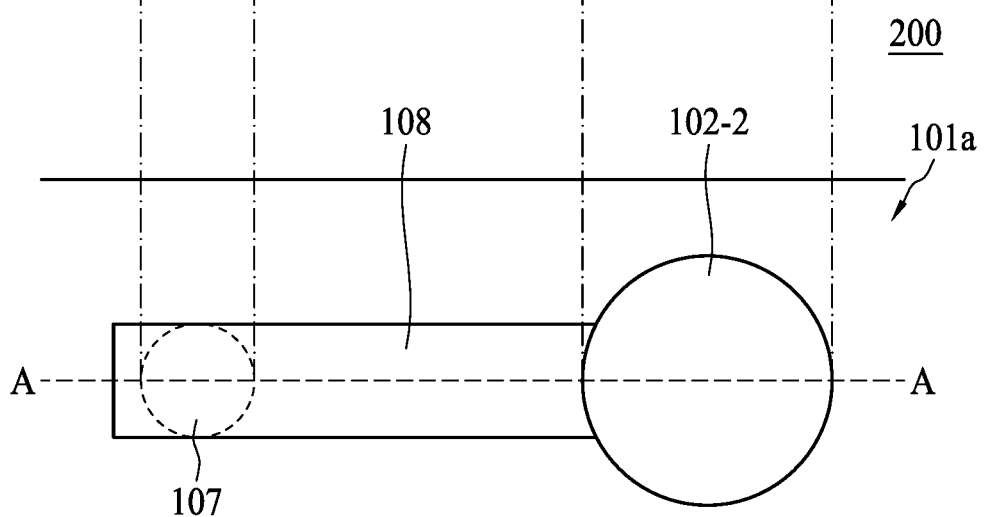
FIG. 2B is a top view of a semiconductor device with a NVIP in accordance with some embodiments of the present disclosure.

For some embodiments as in FIG. 2A, the substrate 101 has an isolation 111 underlying an NVIP 102-2. The NVIP 102-2 is contacting the dielectric 111. FIG. 2B is a top view of the semiconductor device 200 in FIG. 2A and FIG. 2A is a cross sectional view along line AA. The NVIP 102-2 is floated on the dielectric 111 without contacting any conductive feature under a projection area of the NVIP 102-2. Reliability is improved because there is no internal stress from any contacting via to the NVIP 102-2. When there is a requirement to connect the NVIP 102-2 with other conductive features in the substrate 101, a conductive trace 108 on the same level with the NVIP 102-2 is arranged to laterally connecting the NVIP 102-2 to a via 107. The via 107 further connects to a conductive feature 109, which is in the substrate 101 but at a level different from the NVIP 102-2. In some embodiments, the NVIP 102-2 is close to a high pad density region, such as a region with pad pitch below about 300 µm. The conductive trace 108 provides a route for the NVIP 102-2 to connect underlying conductive features at a more open region. Therefore, tradeoff between the pad reliability and circuitry design flexibility is achieved.

In some embodiments, the NVIP 102-2 is configured to receive a conductor or a bump in order to form a semiconductor package. In some embodiments, the NVIP 102-2 may have a diameter substantially equal to the width of conductive trace 108. However, it should be easy to distinguish the difference between the conductive trace 108 and NVIP 102-2 since there is no any bump or conductor either on the conductive trace 108 or above the via 107.

Figure 3A:
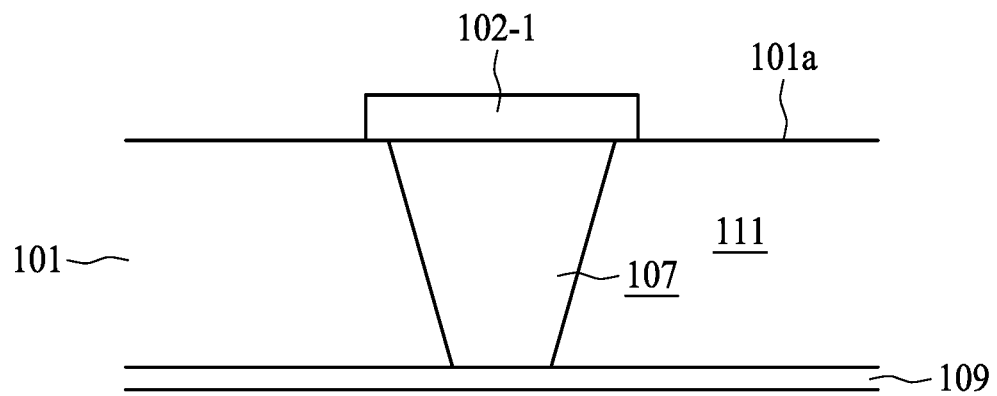
FIG. 3A is a cross sectional view of a semiconductor device with a via in pad (VIP) in accordance with some embodiments of the present disclosure.
Figure 3B:
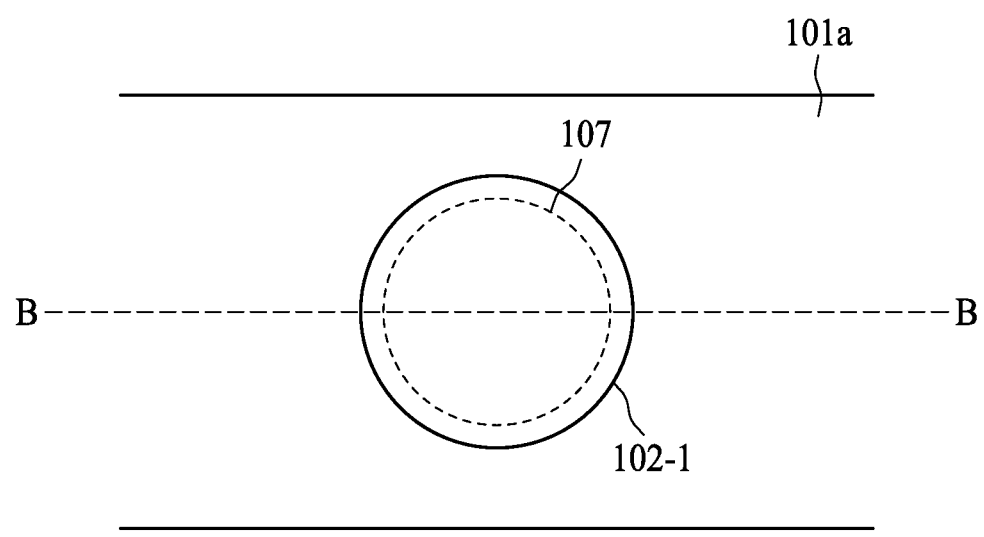
FIG. 3B is a top view of a semiconductor device with a VIP in accordance with some embodiments of the present disclosure.

FIG. 3A is a cross sectional view of FIG. 3B along line BB and illustrating a via-in-pad (VIP) 102-1 according to some embodiments of the present disclosure. Illustrated features labeled with a same numeral as those of in FIG. 2A are same or similar and will not repeated herein for simplicity. The VIP 102-1 is on surface 101a and over dielectric 101a. However, the difference between the VIP 102-1 and the NVIP 102-2 in FIG. 2A is that the VIP 102-1 is contacting a via 107 in the substrate 101. The via 107 is under the projection area of the VIP 102-1 and further connects to the conductive feature 109, which is at a different level from the VIP 102-1. In FIG. 3B, the dotted line within VIP 102-1 represents the contour of via 107. Similar to the NVIP 102-2, VIP 102-1 is configured to receive a conductor or bump, wherein the conductor or bump is a connector between the substrate 101 and the other substrate. A difference between NVIP 102-2 and VIP 102-1 is that the VIP 102-1 is electrically connected with conductive feature 109 (in substrate 101) through a via directly covered by the pad.

Figure 4:
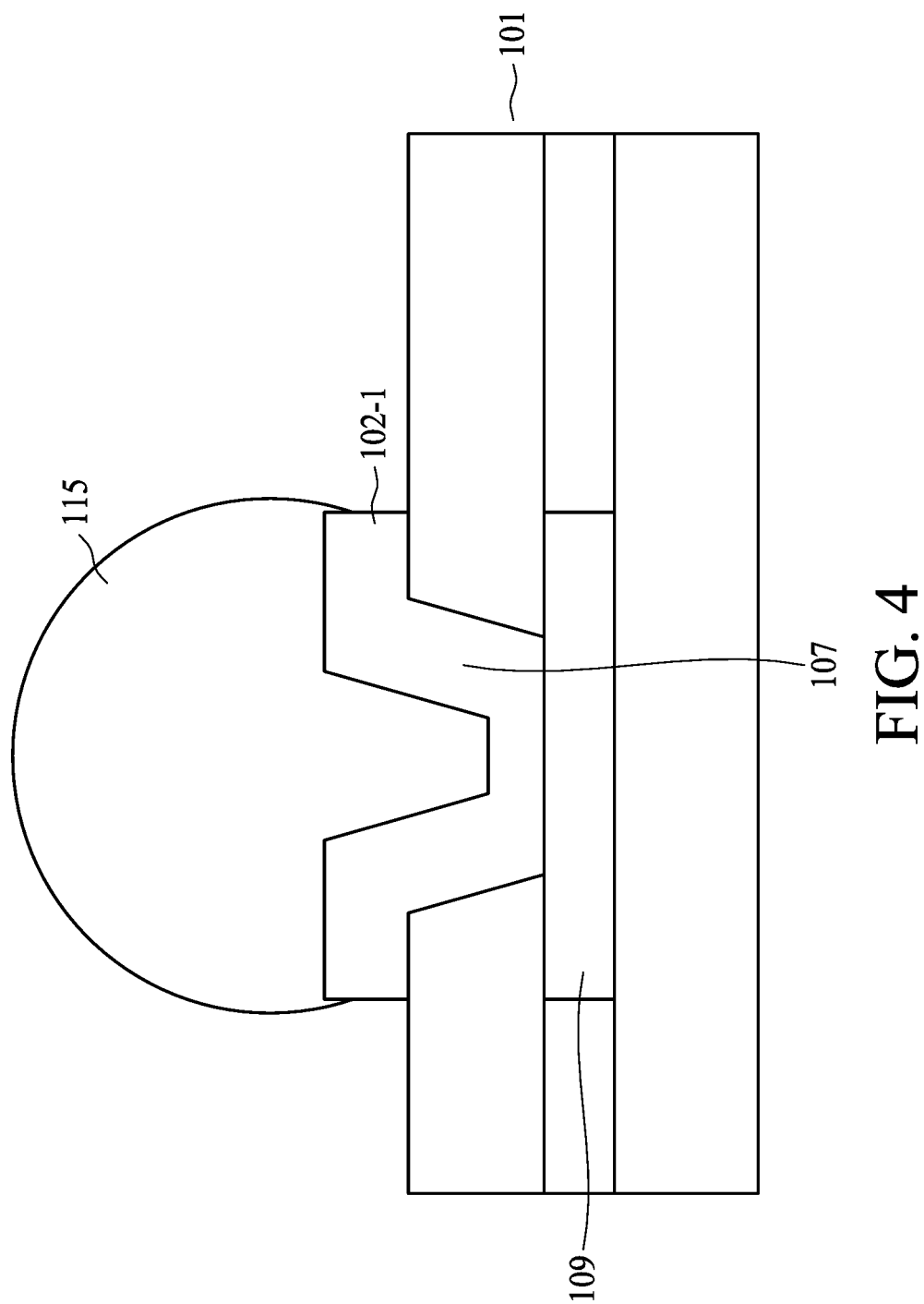
FIG. 4 is a cross sectional view of a semiconductor device with a VIP in accordance with some embodiments of the present disclosure.
Figure 5:
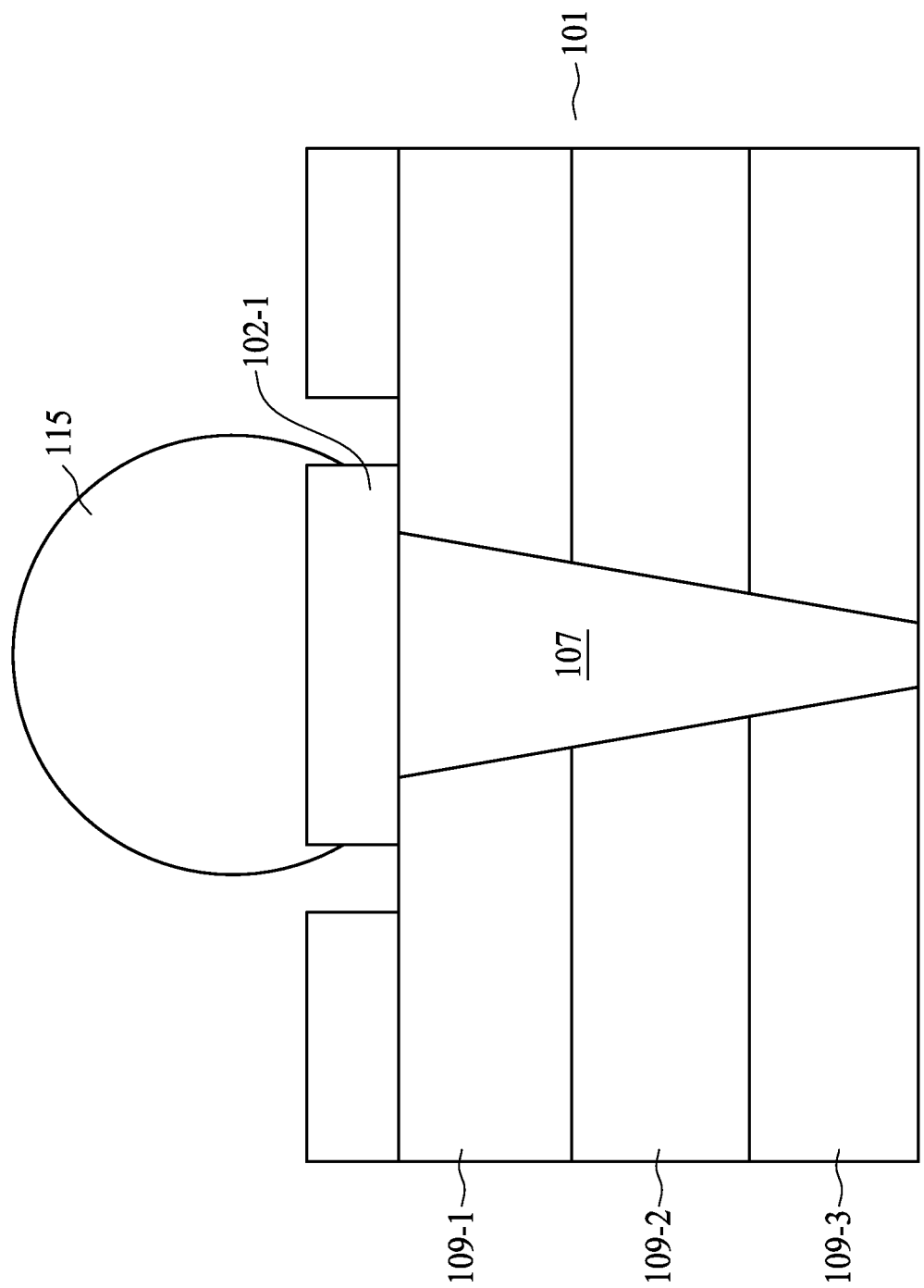
FIG. 5 is a cross sectional view of a semiconductor device with a VIP in accordance with some embodiments of the present disclosure.

The via 107 can be designed in various types in order to meet all requirements for different substrates. For example, as in FIG. 4, the VIP 102-1 merges with the via and connected with the underlying conductive feature 109. A bump 115 is disposed on the VIP 102-1 or said via. As in FIG. 5, the substrate 101 is a printed circuit board (PCB) including several levels of conductive features (109-1, 109-2, 109-3). The conductive features are respectively and independently disposed to form several different conductive layers. The via 107 is a through via penetrating the substrate 101. In some embodiments, there are at least two independent conductive layers been penetrated by the via 107. As in FIG. 5, the via 107 penetrates three conductive layers.

Figure 6A:
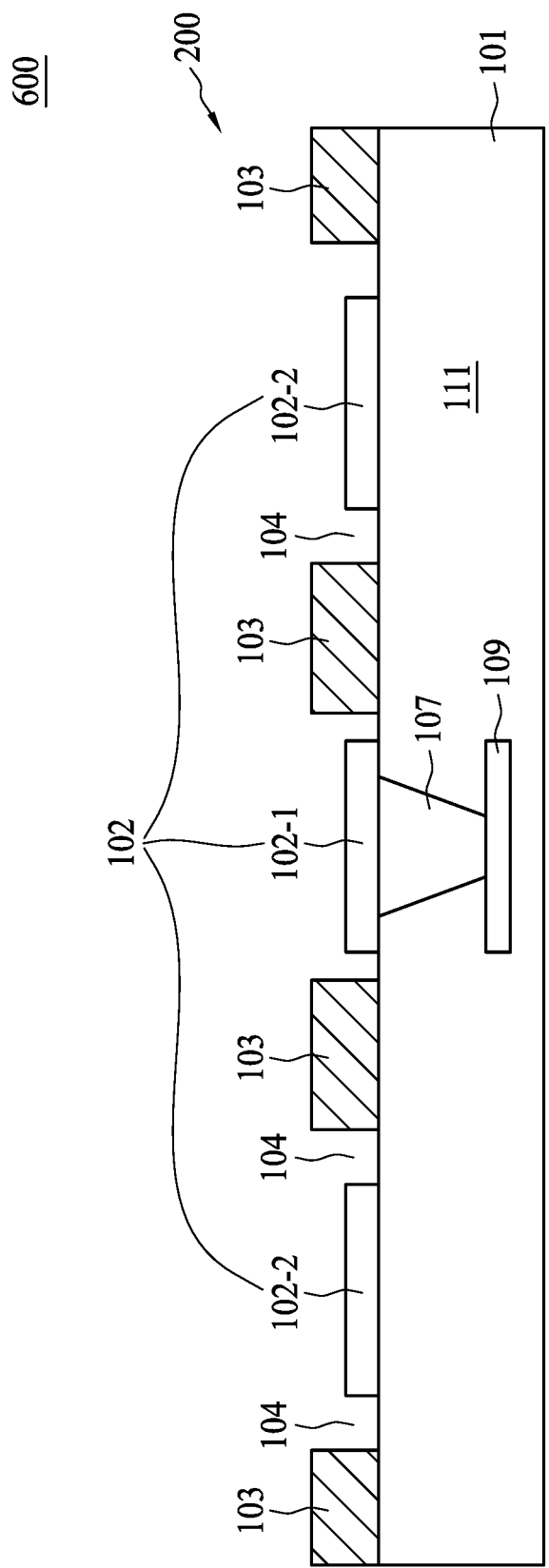
FIG. 6A is a cross sectional view of a semiconductor device with mixed VIP and NVIP in accordance with some embodiments of the present disclosure.

FIG. 6A is an embodiment of a semiconductor device 600. The semiconductor device 600 includes a substrate 101, a mask 103 and several pads 102 disposed on the top surface 101a of the substrate 101. In some embodiments, the pads 102 include VIP pads 102-1 and NVIP pads 102-2. The NVIP pad 102-2 has similar configuration as those of in FIGS. 1A, 1B, 2A and 2B, and the VIP pad 102-1 has similar configuration as those of in FIGS. 3A, 3B, 4, and 5.

Figure 6B:
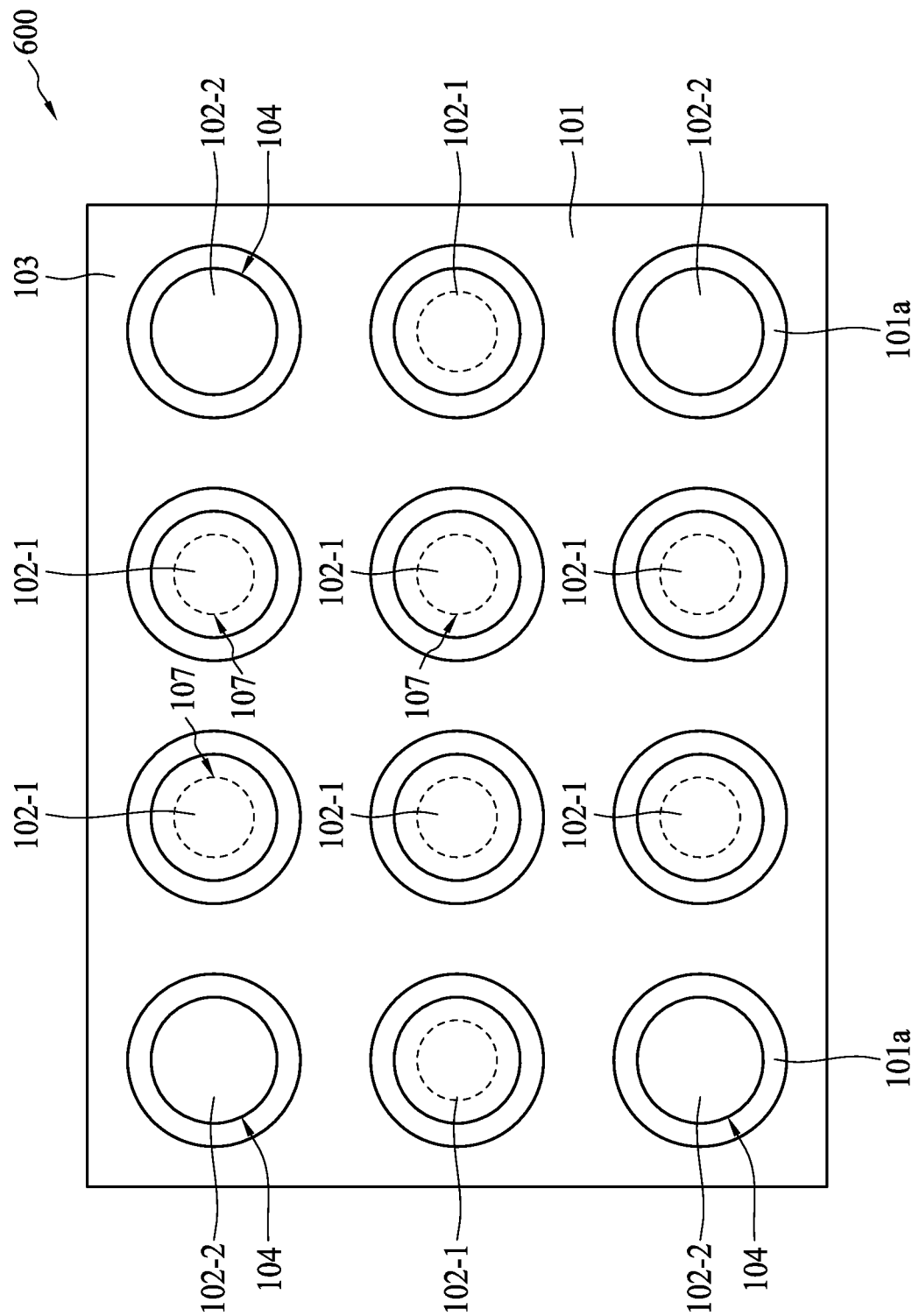
FIG. 6B is a top view of a semiconductor device with mixed VIP and NVIP in accordance with some embodiments of the present disclosure.

FIG. 6B is a top view of an embodiment of a semiconductor device 600 as in FIG. 6A. The semiconductor device 600 includes a substrate 101, several VIP pads 102-1, several NVIP pads 102-2 and a mask 103 disposed over the top surface 101a.

Figure 7A:
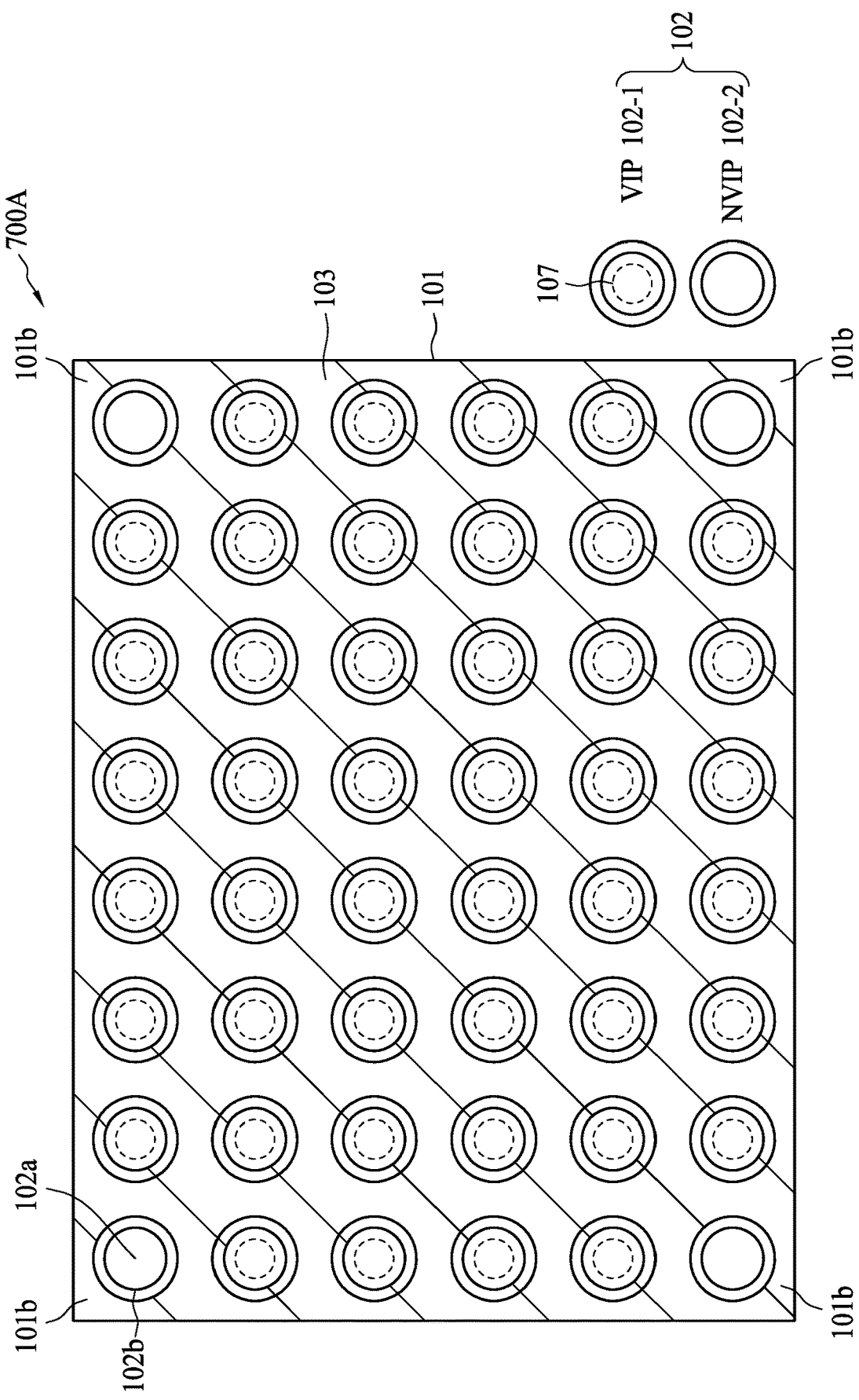
FIG. 7A to FIG. 7C are a top view of a semiconductor device with mixed VIP and NVIP in accordance with some embodiments of the present disclosure.

FIG. 7A is an embodiment of a semiconductor device 700A. The semiconductor device 700A includes a substrate 101, a mask 103 on the substrate 101, a pad array including several VIP pads 102-1 and several NVIP pads 102-2 disposed on the substrate 101. In some embodiments, the VIP pad 102-1 is disposed away from the corner 101b of the substrate 101. In some embodiments, the VIP pad 102-1 is disposed at a central portion of the substrate 101. In some embodiments, the pad pitch is less than about 350 µm.

In some embodiments, the VIP pads 102-1 and the NVIP pads 102-2 are arranged in a regular array. The VIP pads 102-1 and the NVIP pads 102-2 are disposed in several horizontal rows and several vertical columns on the substrate 101. In some embodiments, the VIP pad 102-1 is arranged in a first region and the NVIP pad 102-2 is arranged in a second region. In some embodiments, the first region is more close to the geometric center of the array or substrate compared to the second region. The second region, however, is proximal to a periphery of the pad array or substrate 101 compared to the first region. The periphery of the pad array or substrate 101 can be a corner, edge or any a location distal to the geometric center of the array or substrate.

In some embodiments, the NVIP pad 102-2 is arranged at a predetermined location. In some embodiments, the predetermined location is at a corner 101b of the substrate 101. The NVIP pad 102-2 is configured for receiving a bump which could electrically connects with a pad on another substrate.

In some embodiments, the NVIP pad 102-2 is arranged at the corner 101b because the NVIP pad 102-2 is more endurable under higher stress (no internal stress from underlying via). As such, disposition of the NVIP pad 102-2 at the corner 101b of the substrate 101 provides an improved reliability of the substrate 101 with respect to drop test, board level temperature cycle, board bending, etc and minimize development of cracking and delamination of components.

Figure 7B:
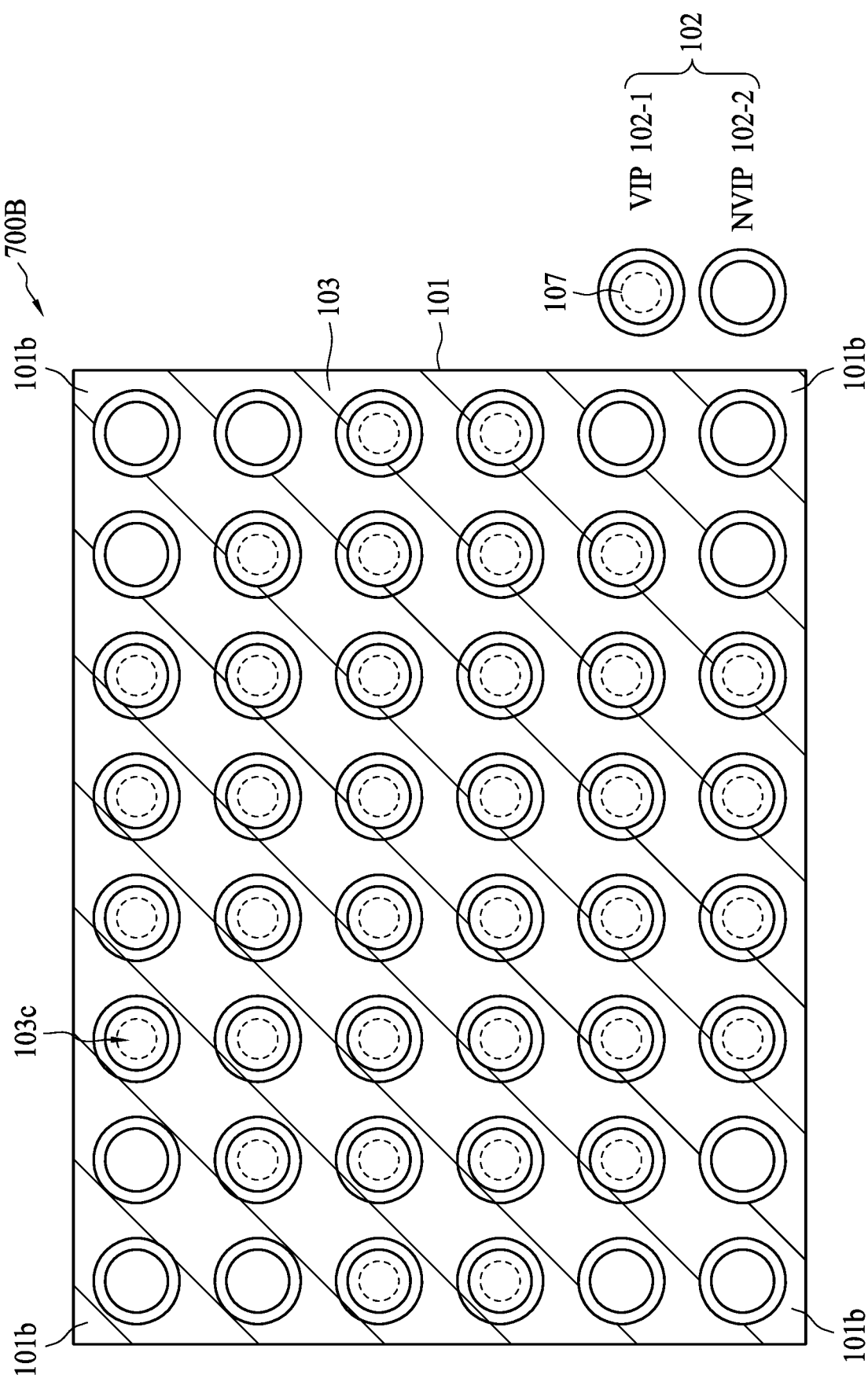

FIG. 7B is an embodiment of a semiconductor device 700B. The semiconductor device 700B includes a substrate 101, a mask 103 on the substrate, several VIP pads 102-1 and several NVIP pads 102-2 disposed on the substrate 101. In some embodiments, the VIP pad 102-1 is disposed at a geometric central portion of the substrate 101 or the pad array.

In some embodiments, the NVIP pad 102-2 is designed to be at a predetermined location which is wither at a corner 101b of the substrate 101 (or the pad array), or at a corner region adjacent to the corner 101b. In some embodiments, an NVIP pad 102-2 neighbors with an NVIP pad 102-2 at the corner 101b. In some embodiments, there are three NVIP pads 102-2 are disposed at the corner 101b and the corner region.

Figure 7C:
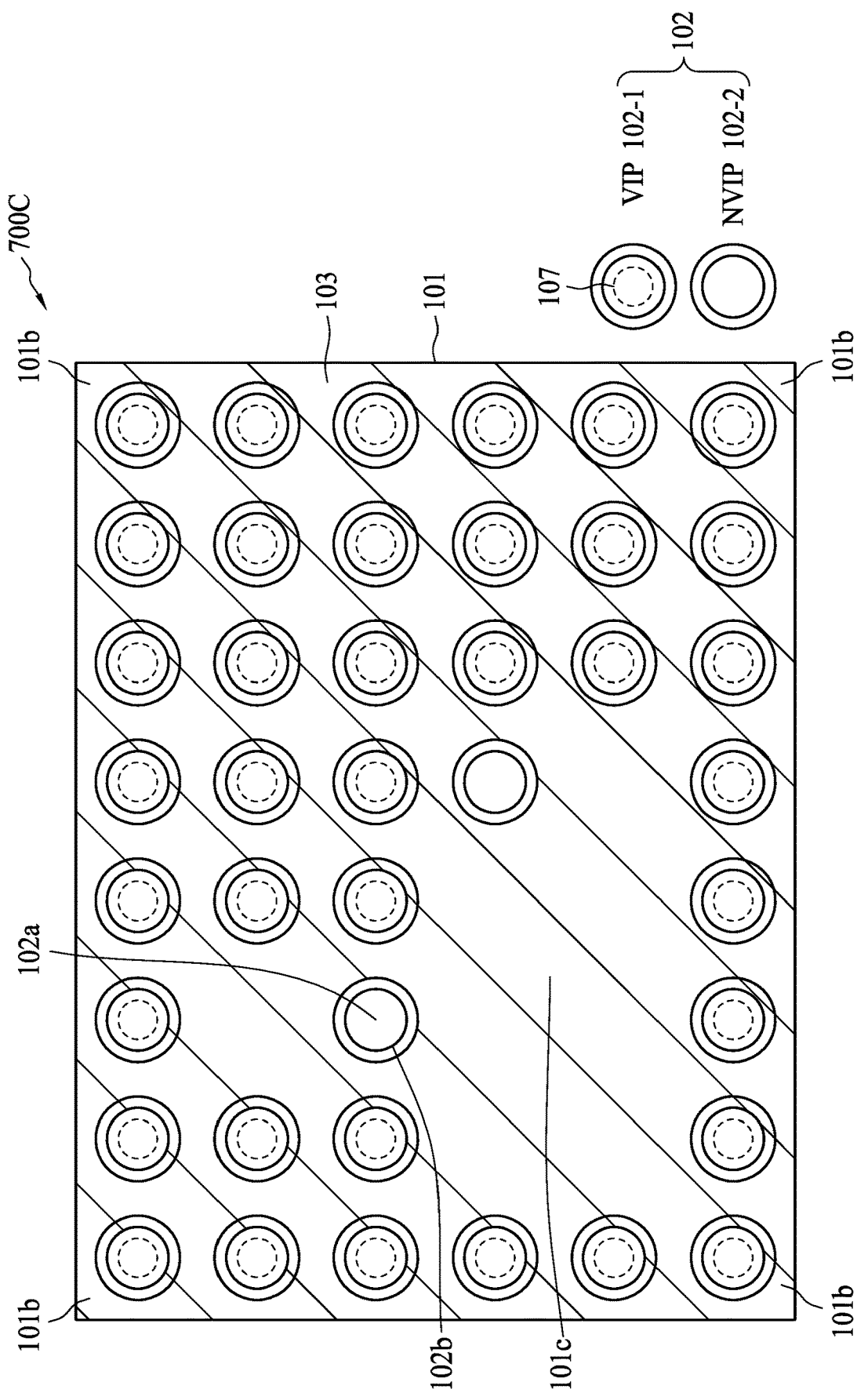

FIG. 7C is an embodiment of a semiconductor device 700C. The semiconductor device 700C includes a substrate 101, a solder mask 103 on the substrate, several VIP pads 102-1 and several NVIP pads 102-2 disposed on the substrate 101. In some embodiments the VIP pads 102-1 and the NVIP pads 101-2 are arranged in an irregular array including a void region 101c which is absent from the VIP pad and the NVIP pad. The void region 101c has a lower pad density compared to other regions in the irregular array.

In some embodiments, the NVIP pad 102-2 is arranged at a position adjacent to the void region 101c of the substrate 101. The pad 102 adjacent to the void region 101c is defined as an isolated pad and is disposed as a NVIP pad 102-2. The isolated pad is neighbored with less than four of the pads 102. In some embodiments, there are two isolated pads adjacent to the void region 101c and disposed as NVIP pads 102-2.

In the present disclosure, a method of manufacturing the abovementioned semiconductor devices is also disclosed. In some embodiments, some of the abovementioned embodiments are formed by a method 800. The method 800 includes a number of operations and the description and illustration are not deemed as a limitation as the sequence of the operations.

Figure 8:
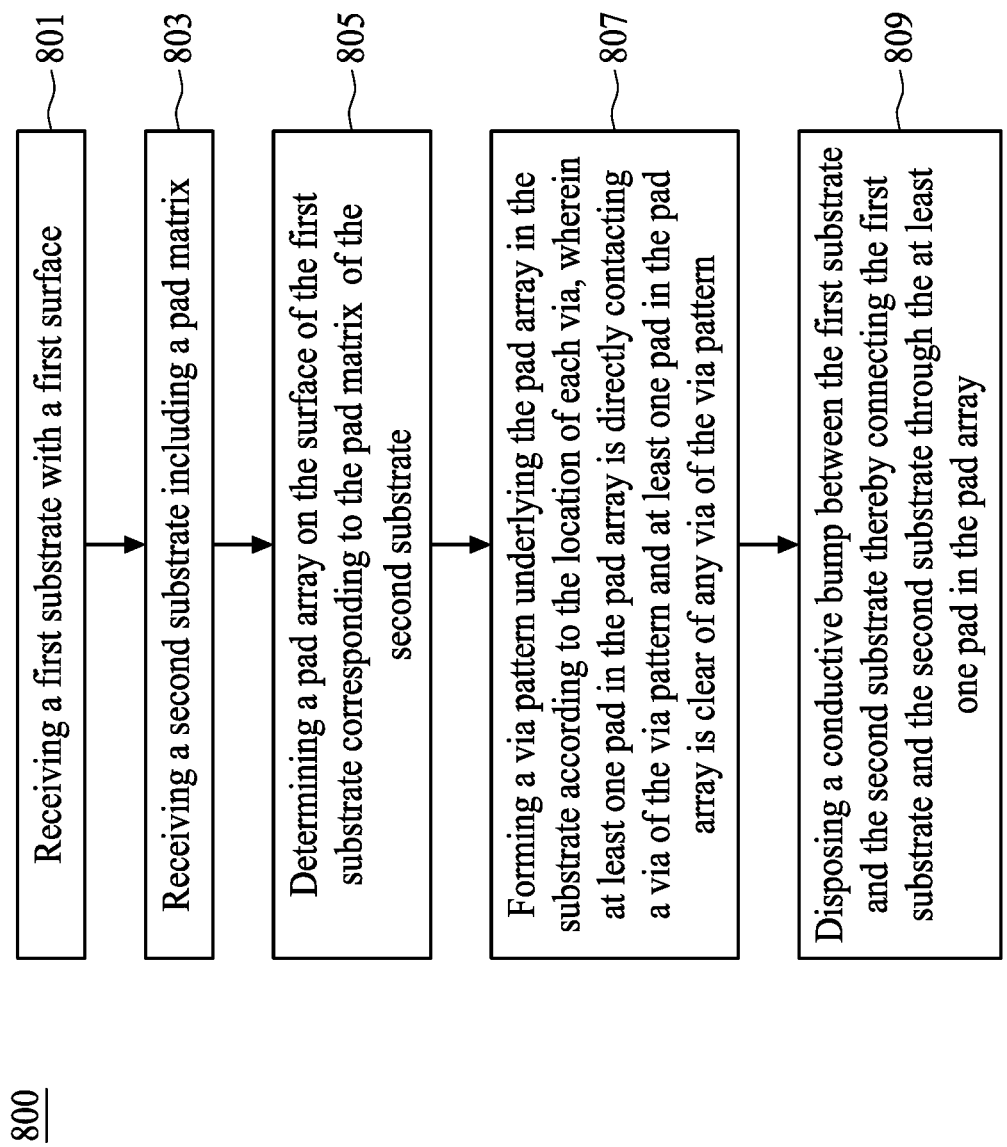
FIG. 8 is a how diagram of a method of manufacturing a semiconductor device in accordance with some embodiments of the present disclosure.

FIG. 8 is an embodiment of a method 800 of manufacturing a semiconductor device. The method 800 includes a number of operations (801, 803, 805, 807, 809).

Figure 9A:
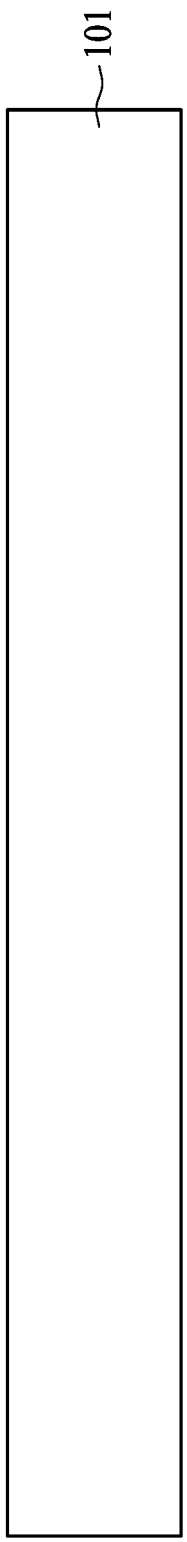
FIG. 9A to FIG. 9E are cross sectional views of a semiconductor device in accordance with some embodiments of the present disclosure.

In operation 801, a first substrate 101 is received as in FIG. 9A. In some embodiments, the first substrate 101 is a silicon substrate for supporting several semiconductor components and carrying a circuitry within the substrate. In some embodiments, the first substrate 101 is a printed circuit board (PCB). The first substrate 101 has a surface 101a.

Figure 9B:
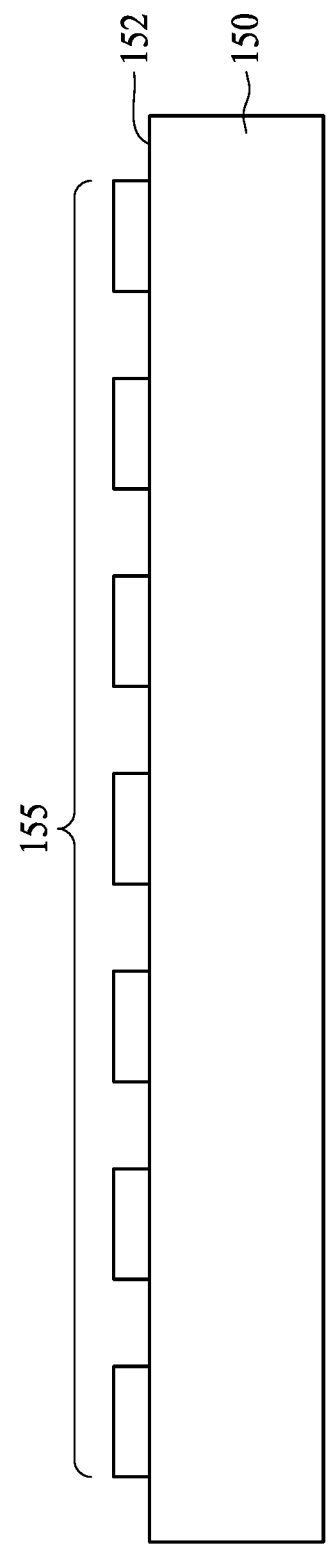

In operation 803, a second substrate 150 is received as in FIG. 9B. In some embodiments, the second substrate 150 includes a semiconductor die (not shown) with several internal interconnects respectively connecting to a corresponding post passivation interconnect (PPI, not shown). The PPI is configured as a pad to connect with another device external to the second substrate 150, for example the first substrate 101. In some embodiments, the PPI is also a portion of an under bump metallurgy (UBM) pad for receiving a bump. The UBM is arranged in a pad matrix 155 on surface 152 of the second substrate 150. Surface 152 is designed to be facing to the surface 152 of the first substrate 101. A semiconductor package is formed through combining the first substrate 101 and the second substrate 150. In some embodiments, the pad matrix 155 includes a conductive material such as gold, silver, copper, nickel, tungsten, aluminum, and/or alloys thereof.

Figure 9C:
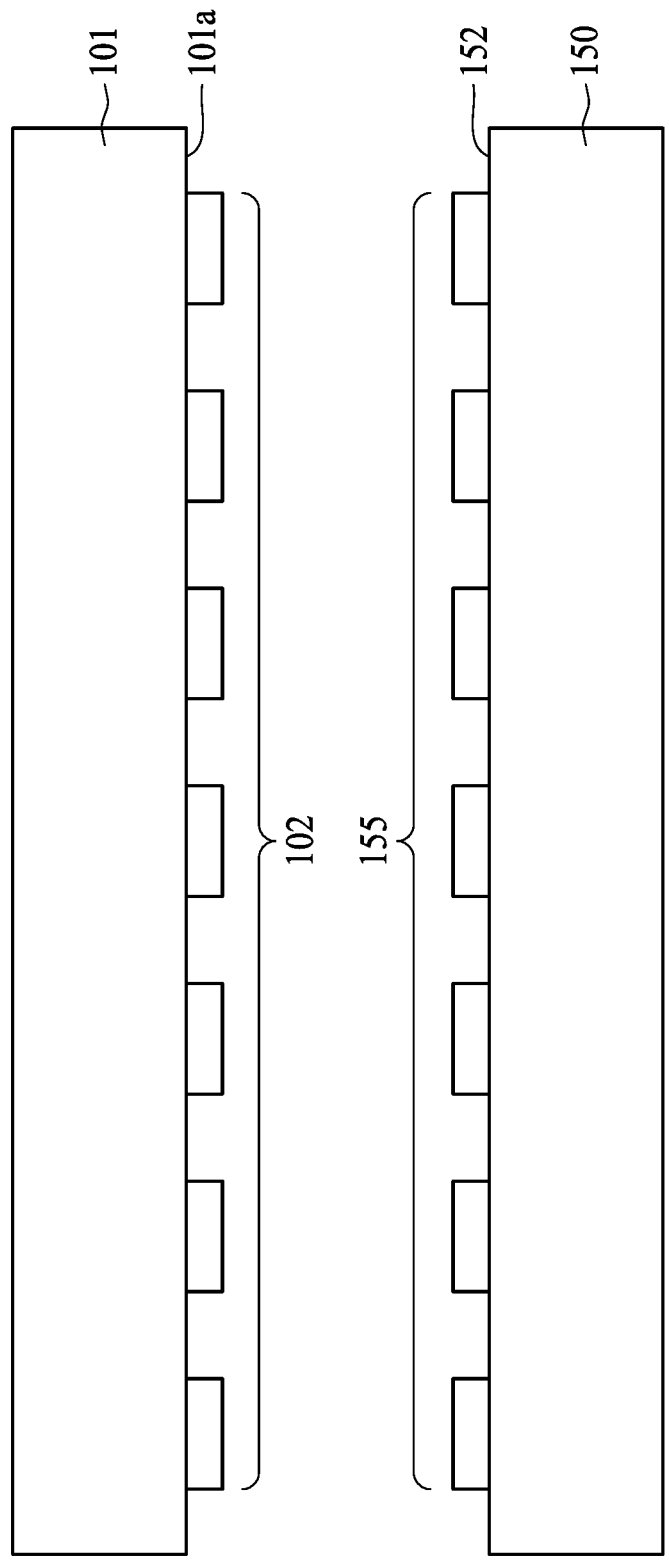

In operation 805 as in FIG. 9C, a pad array 102 is formed on the surface 101a of the first substrate 101. The pad array 102 is formed in a predetermined pattern. The pad array 102 is designed as contact points between the first substrate 101 and the second substrate 150. In some embodiments, the pattern of pad array 102 is corresponding to the pad matrix 155 of the second substrate 150. In FIG. 9C, one pad in the pad array 102 is corresponding to a pad in the pad matrix 155. However, in some embodiments, the correspondence between the pad array 102 and the matrix 155 is one to multiple of multiple to one.

Figure 9D:
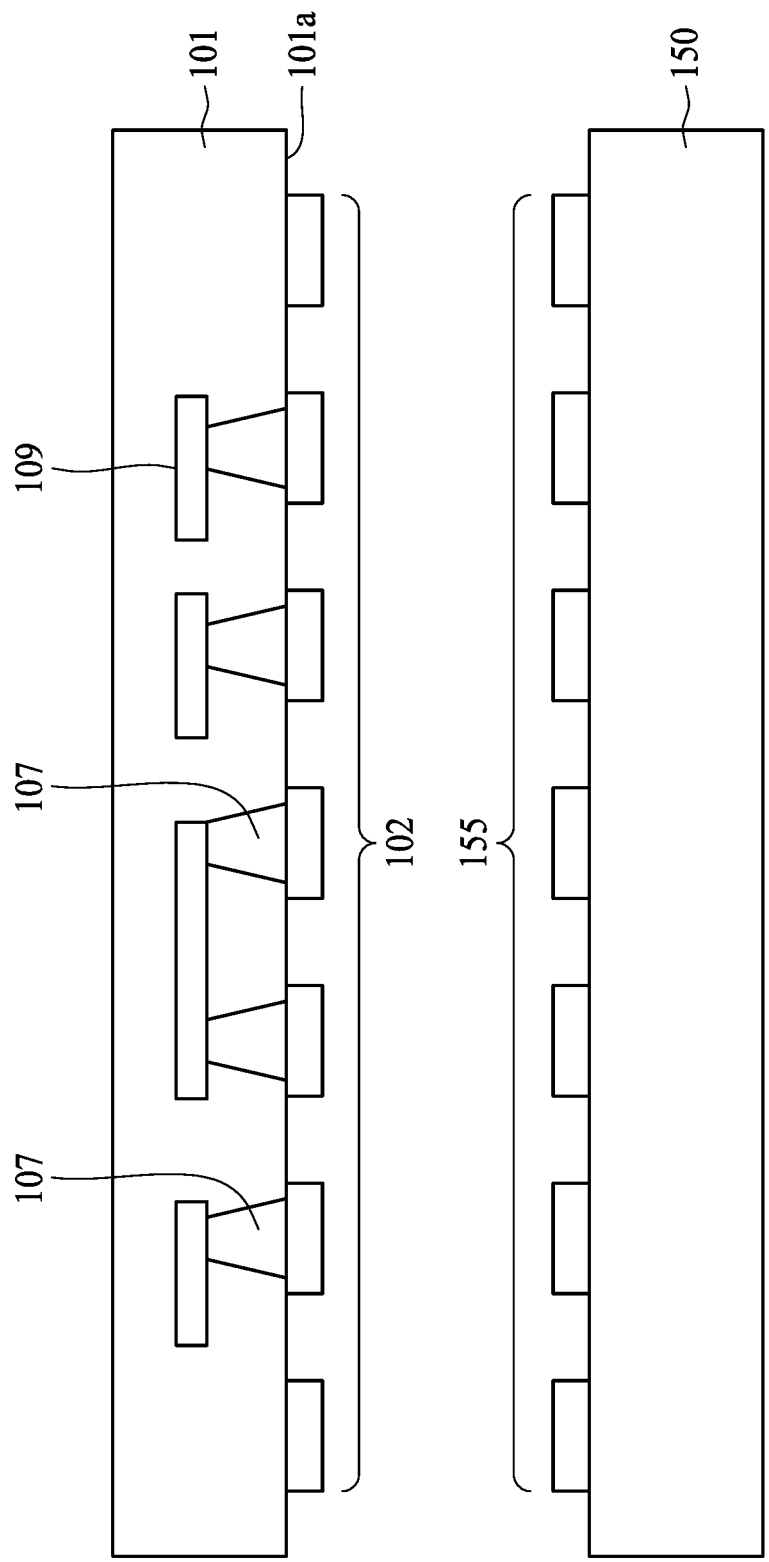

In operation 807 as in FIG. 9D, a via pattern including several via 107 is underlying the pad array in the substrate according to the location of each via, wherein at least one pad in the pad array is directly contacting a via of the via pattern and at least one pad in the pad array is clear of any via of the via pattern. Like pad 102-1, a via is disposed under the pad and connects the pad 102-1 to a conductive feature. For another pad 102-2, there is no via directly disposed underlying the pad.

Although it is shown in a subsequent operation, the vias can be formed prior to forming, the pad array 102. Pad 102-1 is also called to VIP pad and pad 102-2 is also called NVIP pad that are disclosed in the aforementioned embodiments.

Figure 9E:
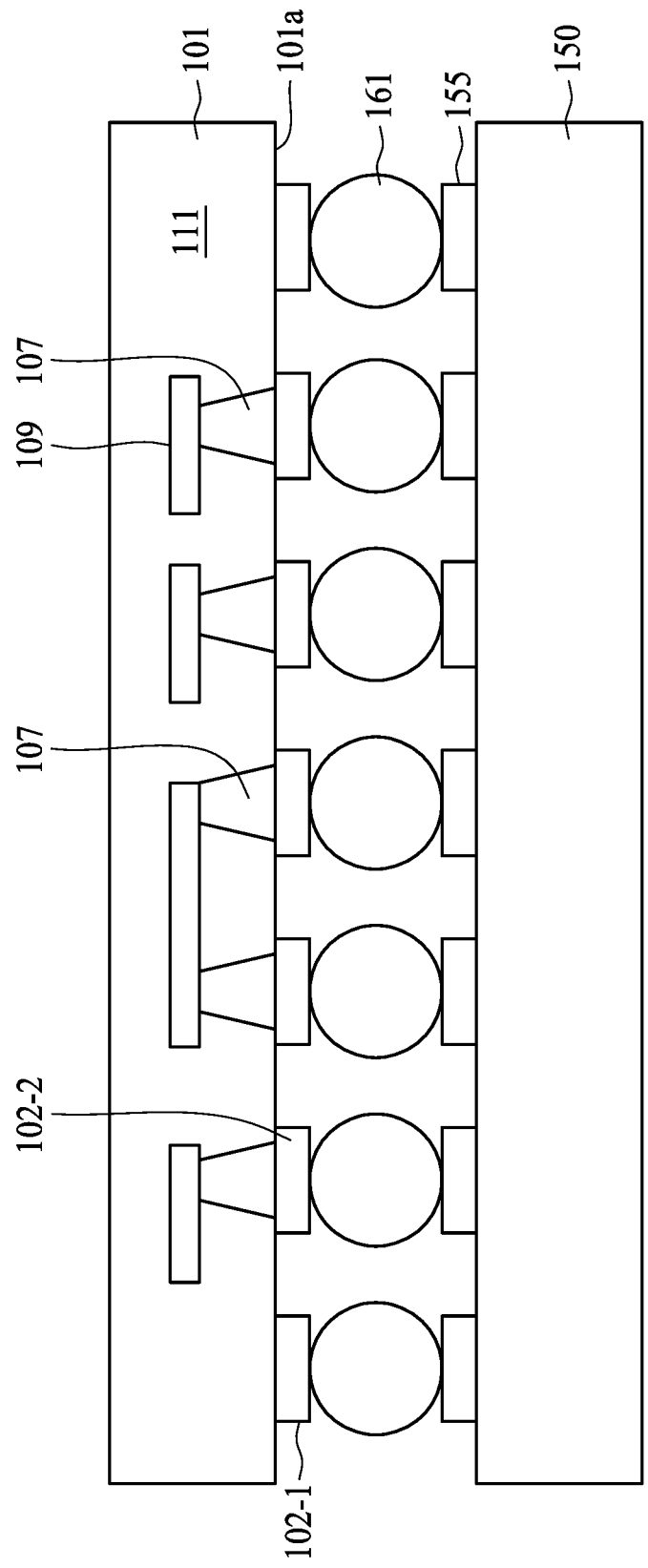

In operation 809 as in FIG. 9E, at least a conductive bump 161 is disposed between the first substrate 101 and the second substrate 150. The conductive bump 161 has one end connecting to the pad array 102 on the first substrate 101 and the other end connecting to the pad matrix 155 on the second substrate 150. Therefore, the first substrate 101 and the second substrate 150 is connected to form a packaged semiconductor device.

Figure 10A:
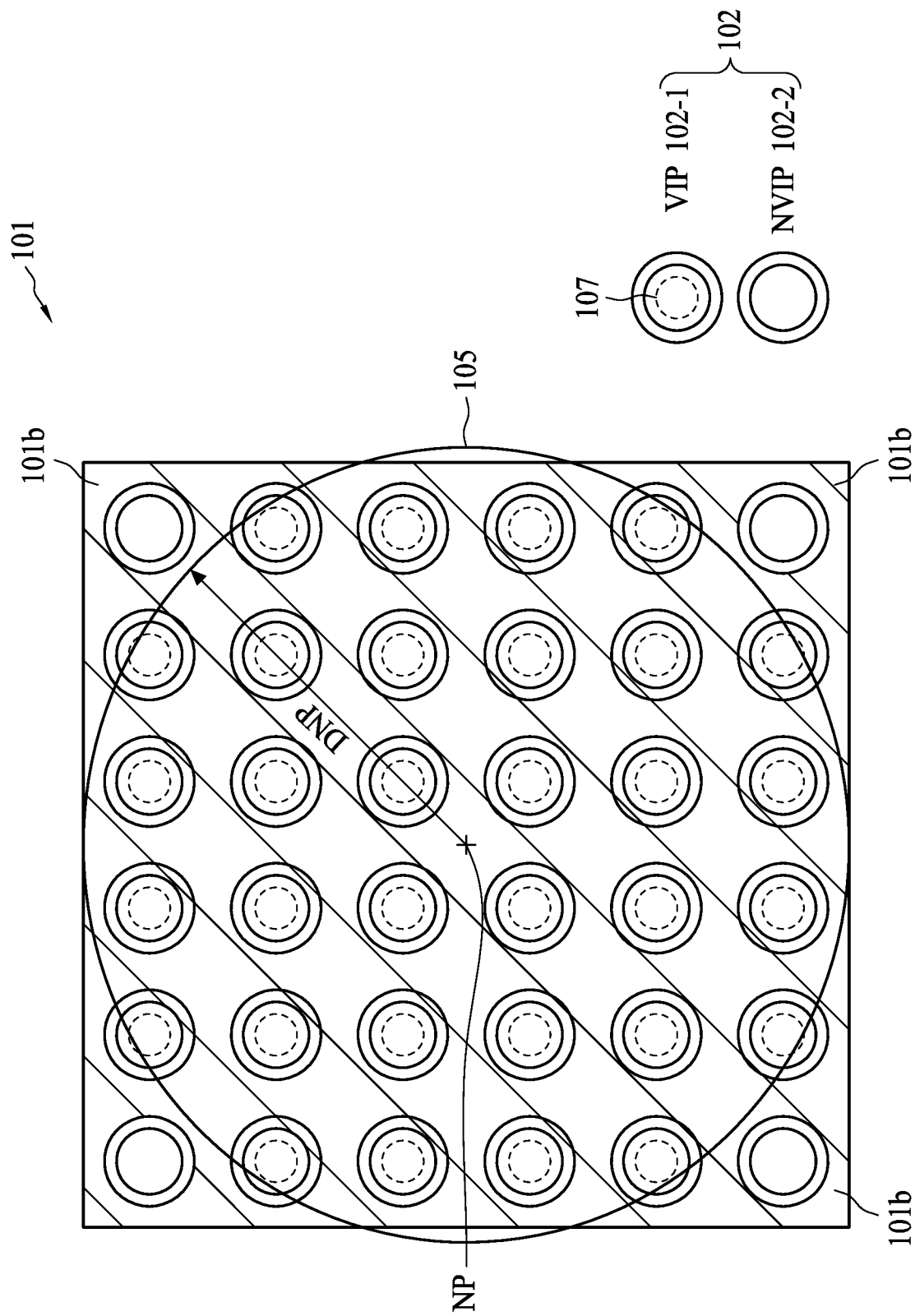
FIG. 10A to FIG. 10E are top views of a semiconductor device in accordance with some embodiments of the present disclosure.

The design of the via pattern is determined by a method in the present disclosure. FIG. 10A is a top view of the substrate 101 as in FIG. 9D. In some embodiments, the position of the NVIP (no via under pad) 102-2 and the position of the VIP (one via under pad) 102-1 are determined by defining a circle 105 with a predetermined neutral point NP and a predetermined diameter DNP. In some embodiments, the circle 105 is centered at the neutral point NP and has a diameter DNP. The neutral point NP is a center of the circle 105.

In some embodiments, the position of the NVIP is determined at a position outside the circle 105, in other word, the pad 102-2 is disposed at a distance greater than a distance DNP between the neutral point NP and a circumference of the circle 105. In some embodiments, the position outside the circle 105 is a corner 101b of the substrate 101. The VIP is disposed at a distance less than a distance DNP between the neutral point NP and the circumference of the circle 105. In some embodiments, the position inside the circle 105 is a central portion of the substrate 101, and thus the VIP pad 102-1 is determined to be located at the central portion.

Figure 10B:
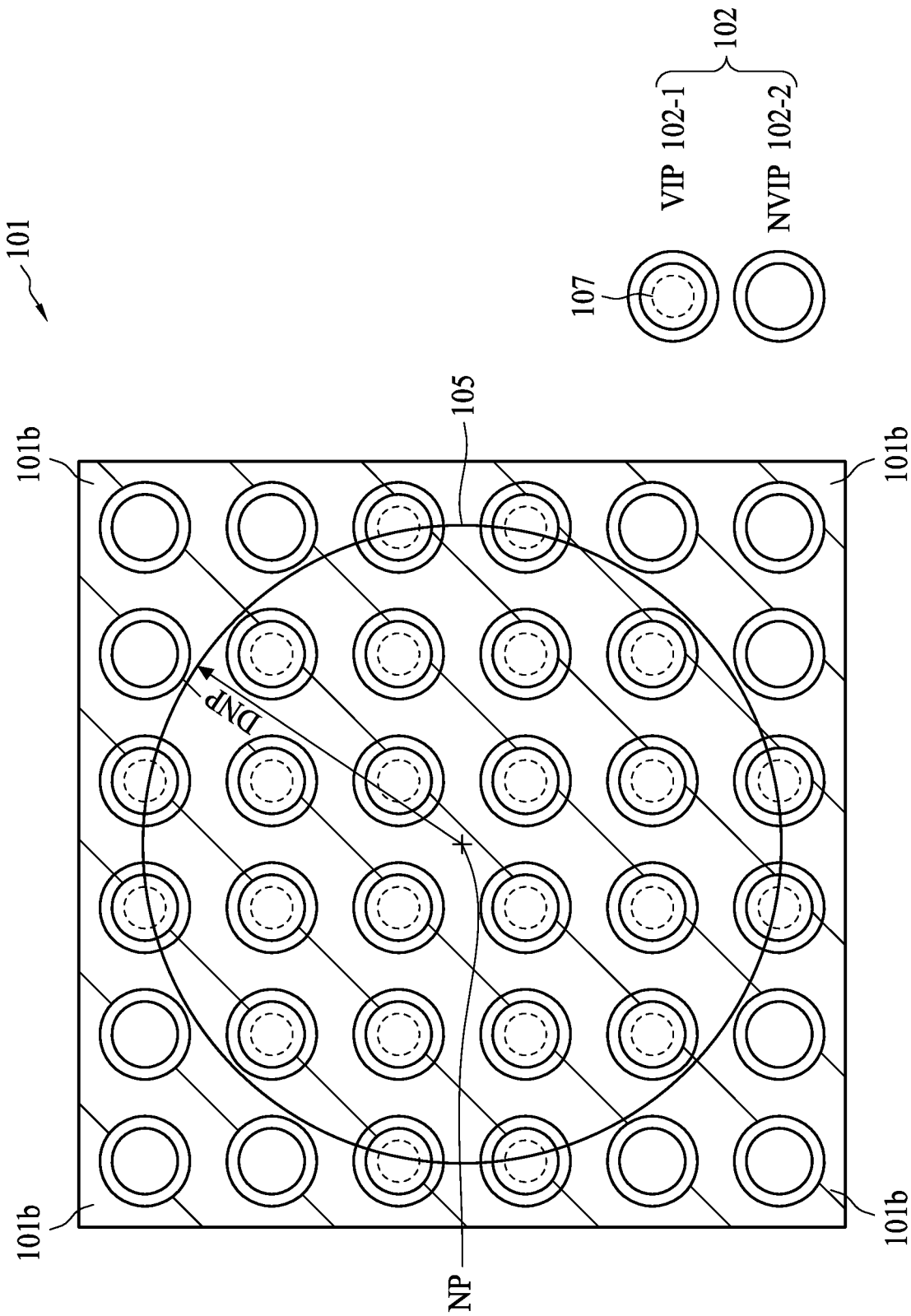

In some embodiments, the positions of the NVIP and VIP are determined by a method as in FIG. 10B. FIG. 10B is a top view of a substrate 101. In some embodiments, the position of the NVIP is determined at a position outside the circle 105. In some embodiments, the pad 102-2 is disposed at a distance greater than a distance DNP between the neutral point NP and a circumference of the circle 105. In some embodiments, the position outside the circle 105 is adjacent to a peripheral of the substrate 101. In some embodiments, there are twelve NVIP disposed on the substrate 101. The VIP pad 102-1 is disposed at a distance less than a distance DNP between the neutral point NP and the circumference of the circle 105.

Figure 10C:
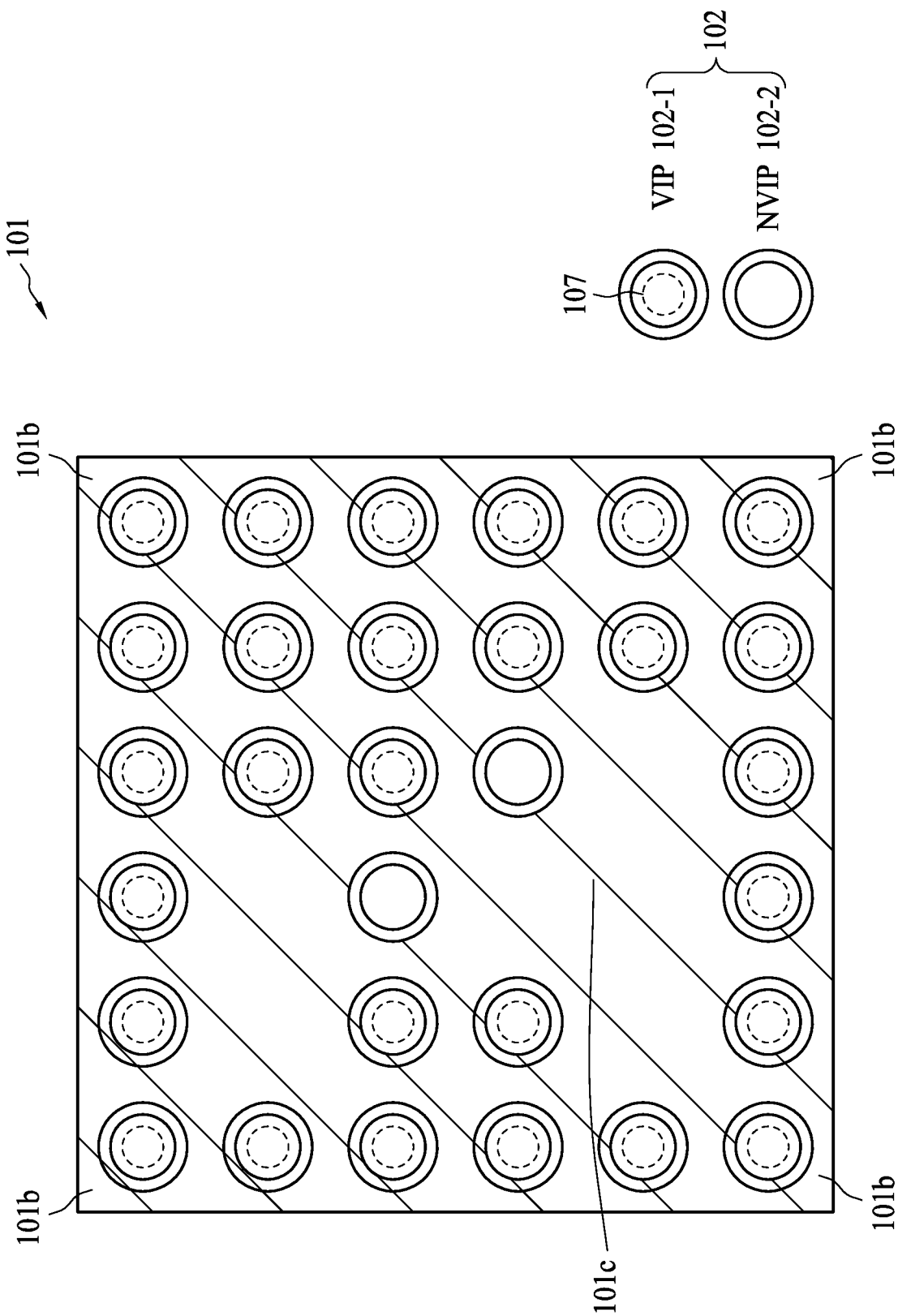

In some embodiments, the positions of the VIP and NVIP are determined by a method as in FIG. 10C. FIG. 10C is a top view of a substrate 101. In some embodiments, the position of the NVIP and the position of the VIP are determined according to a definition of a pad 102 as an isolated pad.

In some embodiments, the pad 102 is defined as the isolated pad according to a pad density in a predetermined region. In some embodiments, if the pad 102 is adjacent to a void region 101c of the substrate 101. In some embodiments, the pad 102 is defined as the isolated pad if the pad 102 is neighbored with less than four of the pads 102. In some embodiments, there are two isolated pads adjacent to the void region 101c, and thus no via is directly disposed under the isolated pad. In some embodiments, a via is disposed directly under and contacting the pad 102 defined as non-isolated pad. The non-isolated pad is the pad 102 neighboring with more than four pads 102.

Figure 10D:
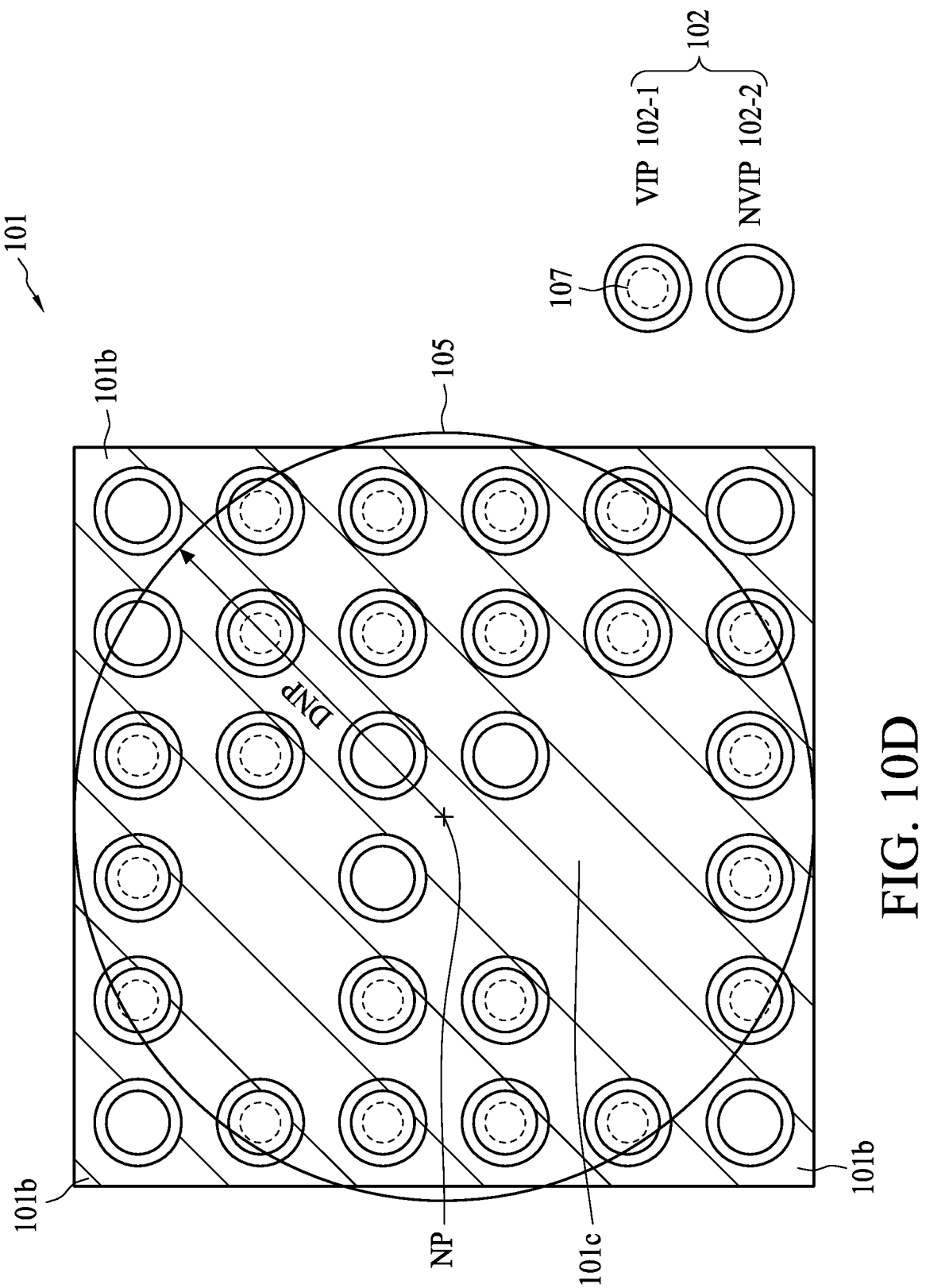

In some embodiments the positions of the first recess and second recess are determined by combination of the methods of FIGS. 10A and 10C as a method in FIG. 10D. FIG. 10D is a top view of a substrate 101. In some embodiments, the position of the via (in dotted line) is determined by defining a pad 102 as an isolated pad as well as defining a circle 105 with a predetermined neutral point NP and a predetermined diameter DNP. No via is disposed under and contacting the pad 102 as the isolated pad adjacent to a void region 101c or outside the circle 105, while a via is disposed under and contacting the pad 102 as a non-isolated pad away from the void region 101c or inside the circle 105.

Figure 10E:
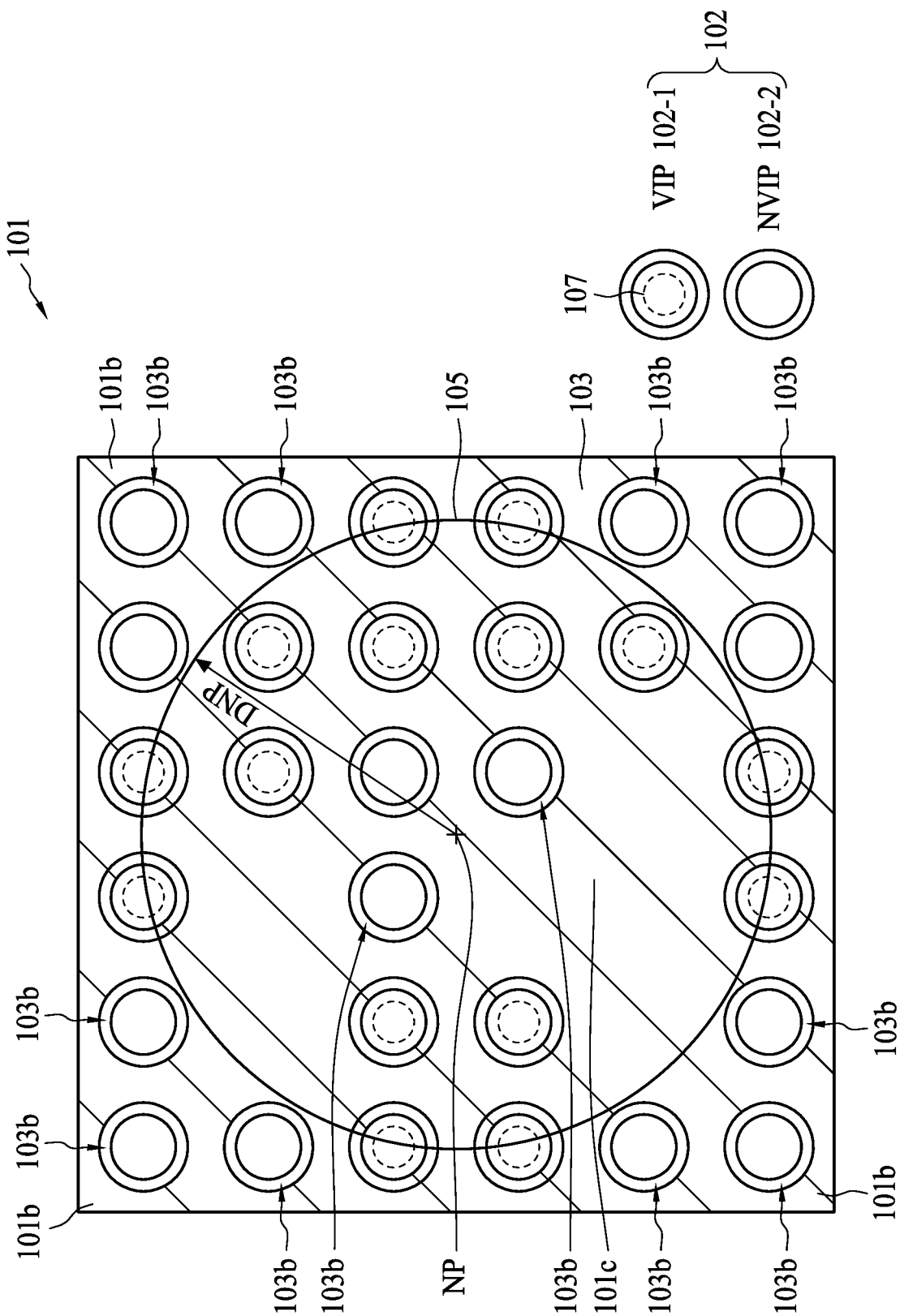

In some embodiments the positions of the first recess and second recess are determined by combination of the methods of FIGS. 10B and 10C as a method in FIG. 10E. FIG. 10E is a top view of a substrate 101. In some embodiments, the position of a via (dotted line) is determined by defining a pad 102 as an isolated pad as well as defining a circle 105 with a predetermined neutral point NP and a predetermined diameter DNP. There is no via disposed right under and contacting the pad 102 as the isolated pad adjacent to a void region 101c or outside the circle 105, while a via is disposed right under and contacting the pad 102 as a non-isolated pad away from the void region 101c or inside the circle 105.

In some embodiments, a method of manufacturing a semiconductor device includes: receiving a first substrate with a surface; receiving a second substrate; determining a pad array on the surface of the first substrate, wherein the pad array includes a first type pad and a second type pad; forming a via pattern underlying the pad array in the first substrate according to the location of each via, wherein the first type pad in the pad array is directly contacting a via of the via pattern and the second type pad in the pad array is clear of any via of the via pattern; laterally connecting the second type pad with a conductive trace, wherein the conductive trace connects to another via that is same level with the via contacting the first type pad; and disposing a first conductive bump and a second conductive bump between the first substrate and the second substrate thereby connecting the first substrate and the second substrate through the first type pad and the second type pad in the pad array.

In some embodiments, a method of manufacturing a semiconductor device includes: receiving a first substrate with a surface; receiving a second substrate; determining a first type pad and a second type pad on the surface of the first substrate; forming a first via in the first substrate to connect the first type pad; laterally connecting the second type pad with a first conductive trace; forming a second via to connect the first conductive trace, wherein the second via is same level with the first via; and disposing a first conductive bump and a second conductive bump on the first type pad and the second type pad respectively for connecting the first substrate and the second substrate.

In some embodiments, a method of manufacturing a semiconductor device includes: receiving a first substrate with a surface; receiving a second substrate; determining a pad array on the surface of the first substrate corresponding to a conductive bump array of the second substrate; forming a via pattern underlying the pad array in the substrate according to the location of each via, wherein at least one pad in the pad array is directly contacting a via of the via pattern and at least one pad in the pad array is clear of any via of the via pattern, and disposing a first conductive bump and a second conductive bump between the first substrate and the second substrate thereby connecting the first substrate and the second substrate through the t least one pad in the pad array.

The methods and features of this invention have been sufficiently described in the above examples and descriptions. It should be understood that any modifications or changes without departing from the spirit of the invention are intended to be covered in the protection scope of the invention.

Moreover, the scope of the present application in not intended to be limited to the particular embodiments of the process, machine, manufacture, and composition of matter, means, methods and steps described in the specification. As those skilled in the art will readily appreciate from the disclosure of the present disclosure, processes, machines, manufacture, composition of matter, means, methods or steps presently existing or later to be developed, that perform substantially the same function or achieve substantially the same result as the corresponding embodiments described herein may be utilized according to the present disclosure.

Accordingly, the appended claims are intended to include within their scope such as processes, machines, manufacture, compositions of matter, means, methods or steps. In addition, each claim constitutes a separate embodiment, and the combination of various claims and embodiments are within the scope of the invention.

The invention claimed is:

1. A method of manufacturing a semiconductor device, comprising:
   receiving a first substrate with a surface;
   receiving a second substrate;
   determining a pad array on the surface of the first substrate, wherein the pad array includes a first type pad and a second type pad;
   forming a via pattern underlying the pad array in the first substrate according to the location of each via, wherein the first type pad in the pad array is directly contacting a via of the via pattern, a projection area of the via contacting the first type pad on the surface is located within and smaller than a projection area of the first type pad on the surface, and the second type pad in the pad array is clear of any via of the via pattern;
   laterally connecting the second type pad with a conductive trace, wherein the conductive trace connects to another via that is same level with the via contacting the first type pad; and
   disposing a first conductive bump and a second conductive bump between the first substrate and the second substrate thereby connecting the first substrate and the second substrate through the first type pad and the second type pad in the pad array.

2. The method of claim 1, further comprising calculating a distance of each pad of the pad array from a neutral point of the pad array.

3. The method of claim 1, further comprising calculating a pad density in a predetermined region.

4. The method of claim 1, further comprising bonding the first substrate to the second substrate with the first conductive bump and the second conductive bump.

5. The method of claim 1, further comprising defining a circle with a predetermined neutral point and a predetermined diameter to determine the via pattern.

6. A method of manufacturing a semiconductor device, comprising:
- receiving a first substrate with a surface;
- receiving a second substrate;
- determining a first type pad and a second type pad on the surface of the first substrate, wherein each of the first type pad and the second type pad extends in a first direction along the surface of the first substrate;
- forming a first via in the first substrate, in a second direction perpendicular to the surface of the first substrate, to connect the first type pad at an end of the first via;
- laterally connecting the second type pad with a first conductive trace;
- forming a second via to connect the first conductive trace, wherein the second via is same level with the first via; and
- disposing a first conductive bump and a second conductive bump on the first type pad and the second type pad respectively for connecting the first substrate and the second substrate.

7. The method of claim 6, further comprising arranging the first type pad in a first region of the surface and arranging the second type pad in a second region of the surface, wherein the second region is more proximal to a periphery of the first substrate.

8. The method of claim 6, further comprising connecting the first via with a second conductive trace underlying the first type pad.

9. The method of claim 6, wherein the first substrate includes a plurality of levels of conductive features and the first via and the second penetrate through the plurality of levels of conductive features.

10. The method of claim 6, further comprising arranging the second type pad to be proximal to a corner of the first substrate.

11. The method of claim 6, further comprising arranging the first type pad and the second type pad in an irregular array including a void region, wherein the void region has a lower pad density compared to other regions in the irregular array.

12. The method of claim 6, further comprising arranging the second type pad to be symmetrically to a geometric center of the pad array.

13. The method of claim 6, wherein the second type pad has a diameter substantially equal to a width of the first conductive trace.

14. The method of claim 6, further comprising connecting the second via to a third conductive feature.

15. The method of claim 14, wherein the third conductive feature is in the first substrate and at a level different from the second type pad.

16. A method of manufacturing a semiconductor device, comprising:
- receiving a first substrate with a surface;
- receiving a second substrate;
- determining a pad array on the surface of the first substrate corresponding to a conductive bump array of the second substrate;
- forming a via pattern underlying the pad array in the substrate according to the location of each via, wherein at least one first pad in the pad array is directly contacting a via of the via pattern, a projection area of the via contacting the at least one first pad on the surface is located within and smaller than a projection area of the at least one first pad on the surface, and at least one second pad in the pad array is clear of any via of the via pattern, and
- disposing a first conductive bump and a second conductive bump between the first substrate and the second substrate thereby connecting the first substrate and the second substrate through the at least one first pad and the at least one second pad in the pad array.

17. The method of claim 16, further comprising calculating a distance of each pad of the pad array from a neutral point of the pad array.

18. The method of claim 16, further comprising calculating a pad density in a predetermined region.

19. The method of claim 16, further comprising bonding the first substrate to the second substrate with the conductive bump array.

20. The method of claim 16, further comprising defining a circle with a predetermined neutral point and a predetermined diameter to determine the via pattern.

* * * * *